United States Patent [19]

Ito

[11] Patent Number: 5,406,700
[45] Date of Patent: Apr. 18, 1995

[54] METHOD FOR PRODUCING PIN INTEGRATED CIRCUIT LEAD FRAME

[75] Inventor: Yuji Ito, Nagano, Japan

[73] Assignee: Seiko Epson Corporation, Tokyo, Japan

[21] Appl. No.: 273,270

[22] Filed: Jul. 11, 1994

Related U.S. Application Data

[60] Continuation-in-part of Ser. No. 209,677, Mar. 10, 1994, which is a continuation of Ser. No. 27,064, Mar. 4, 1993, abandoned, which is a division of Ser. No. 777,120, Oct. 16, 1991, Pat. No. 5,229,638.

[30] Foreign Application Priority Data

Nov. 20, 1990 [JP] Japan ............................. 2-315427
Sep. 26, 1991 [JP] Japan ............................. 3-247319

[51] Int. Cl.$^6$ ............................................. H01R 43/00
[52] U.S. Cl. .................................. 29/827; 437/206; 437/220
[58] Field of Search .................. 437/220, 206; 29/827

[56] References Cited

U.S. PATENT DOCUMENTS

| | | | |
|---|---|---|---|
| 4,847,911 | 7/1989 | Morimoto et al. | 382/8 |
| 5,007,097 | 4/1991 | Mizuoka et al. | 382/8 |
| 5,119,436 | 6/1992 | Holdgrafer | 382/8 |

FOREIGN PATENT DOCUMENTS

| | | | |
|---|---|---|---|
| 57-194539 | 11/1982 | Japan | 437/220 |
| 2-156659 | 6/1990 | Japan | 437/220 |
| 2-210854 | 8/1990 | Japan | 437/220 |
| 3-14263 | 1/1991 | Japan | 437/220 |
| 3-30362 | 2/1991 | Japan | 437/220 |
| 3-123063 | 5/1991 | Japan | 437/220 |

Primary Examiner—Carl J. Arbes
Attorney, Agent, or Firm—Ladas & Parry

[57] ABSTRACT

Disclosed is an integrated circuit lead frame which comprises: a die-pad; die-pad suspension leads for supporting the die-pad; a number of inner leads provided around the die-pad so as to be separated from the die-pad at a predetermined distance, and connected through wires with electrodes of an integrated circuit fixed onto the die-pad; wherein a step portion having a sharp corner portion is provided in at least one portion of the lead frame. Further disclosed is a method of producing such an integrated circuit lead frame as mentioned above, wherein a portion between one of the die-pad suspension leads and one of the inner leads adjacent to the one die-pad suspension lead is stamped out through two or more steps to thereby form a step portion having a sharp corner portion in a side portion of the one die-pad suspension lead or the one inner lead. Thus, since the step portion is formed through two or more steps, the step portion may have an corner portion which is sharp and which has no shear drop so that it is possible for an image recognition apparatus to recognize the step portion accurately and rapidly to thereby perform the recognition with no error.

18 Claims, 14 Drawing Sheets

METHOD FOR PRODUCING PIN INTEGRATED CIRCUIT LEAD FRAME

This is a continuation-in-part of application Ser. No. 08/209,677 filed on Mar. 10, 1994 which is a continuation of Ser. No. 08/027,064 filed on Mar. 4, 1993 (now abandoned) which is a divisional of Ser. No. 07/777,120 filed on Oct. 16, 1991 which is now Pat. No. 5,229,638.

BACKGROUND OF THE INVENTION

1. Field of the Invention

The present invention relates to an integrated circuit lead frame and a method of producing the same, and particularly relates to an integrated circuit lead frame for mounting an integrated circuit chip thereon and a method of producing the same.

2. Description of the Related Art

FIG. 11 is a plan view illustrating an example of a conventional lead frame for mounting an integrated circuit chip thereon. The reference numeral 1 represents a lead frame formed by working a thin metal plate. In the lead frame 1, outer leads 2 ape connected to inner leads 3 through a connection portion called a damper 6, and a substantially square die-pad 8 for mounting an integrated circuit chip thereon is provided at a center portion of the lead frame 1 with a predetermined distance from top end portions of the inner leads 3 and supported at its four corners by die-pad suspension leads 9, 9a, 9b and 9c which are connected to the damper 6.

In assembling an integrated circuit using such a lead frame, as shown in FIG. 12, wire bonding is performed so as to connect respective electrodes 11 of an integrated circuit chip 11 fixed on the die-pad 8 to the corresponding inner leads 3 through metal wires 12.

In such a wire bonding process, in order to improve the bonding position accuracy between the respective electrodes 11 of the integrated circuit chip 10 and the corresponding inner leads 3, positional correction is performed on the integrated circuit chip 10 side as well as on the inner leads 3 side before starting wire bonding, bonding positions are decided on the basis of the correction values, and then the wire bonding is cart ed out.

In this case, for the positional correction on the inner leads 3 side, generally, a desired one inner lead, or two inner leads, for example, 3 and 3m, adjacent to a pair of opposite die-pad suspension leads 9 and 9a respectively as shown in FIG. 11 are used, and correction is made while, at a top end portion 4 of each of the inner leads 3 and 3m, a target, that is, a peripheral shape including a corner portion 7 formed between the top end portion 4 and a side portion 5 thereof as shown in FIG. 12, is recognized by using an image recognition apparatus.

Further, in order to clarify the recognition/correction position on the inner lead 3, another method in which a hole 13 is provided in the inner lead 3 as shown in FIG. 13 has been used. In FIGS. 12 and 13, each of hatched portions 14 and 15 shows an area of a shape image to be stored in the case of using an image recognition apparatus.

Recently, as functions of a semiconductor device increases, a demand for increasing the number of input/output terminals of an integrated circuit has become high sharply, and a semiconductor device having more than 200 pins has appeared today.

In order to respond to such a demand, a measure to form a multi-pin lead frame by making inner leads thereof very small has been progressed. As a result, the width of the top end portion of reach inner lead which has been 0.3 mm or more becomes narrow to reach 0.1 mm. Accordingly, the following problem has occurred in performing bonding position correction on the inner lead side.

(1) If the inner leads 3 are made very small, the shapes of the top end portions 4 of the respective inner leads 3 become substantially the same as shown in FIG. 14, so that the respective inner leads 3 have no difference in shape, that is, in shape features, such as a lead width, and an angle formed at a top end corner portion, and so on.

It is therefore difficult to distinguish adjacent inner leads 3, 3a . . . so that a worker and an image recognition apparatus make an error in recognizing an objective inner lead 3 in the above-mentioned method to thereby erroneously judge that an inner lead, for example 3a, other than the objective inner lead 3 is the objective inner lead to be recognized and corrected as shown in FIG. 15, and the inner lead 3a is connected not to a corresponding electrode 11b of the integrated circuit chip 10 but to an erroneous electrode 11a. Thus, sometimes, there occurs a case where bonding is carried out with extreme positional displacement.

(2) In addition, it has been difficult to realize the method in which a hole 13 is formed in an objective inner lead 3, which has been described with reference to FIG. 13, since the width of the inner lead 3 is very narrow.

SUMMARY OF THE INVENTION

It is therefore an object of the present invention to solve the above problems.

It is another object of the present invention to provide an integrated circuit lead frame having a shape which can be recognized rapidly and surely in wire bonding and method of producing the same.

The integrated circuit lead frame according to the present invention comprises a step portion having a sharp corner portion and provided in at least one portion of the lead frame.

Further, the integrated circuit lead frame according to the present invention comprises a step portion provided in at least one of die-pad suspension leads or one of inner leads adjacent to the one die-pad suspension lead.

Further, the integrated circuit lead frame according to the present invention comprises a step portion provided in each of opposite ones of die-pad suspension leads or ones of inner leads adjacent to the opposite die-pad suspension leads.

In order to produce the above-mentioned integrated circuit lead frame, a portion between a die-pad suspension lead and an inner lead adjacent thereto is stamped out through two or more steps to thereby form a step portion having a sharp corner portion in a side portion of the die-pad suspension lead or in a side portion of the inner lead.

Further, a portion between a die-pad suspension lead and an inner lead adjacent thereto is stamped out by means of a first punch having a length a little longer than the distance from a top end portion of the inner lead to a step portion to be formed and having a width which agrees with the interval between the die-pad suspension lead and the inner lead adjacent thereto; and the rest portion is stamped out by means of a second punch wider than the first punch to thereby form the step portion.

The shape of a step portion is recognized as an image by an image recognition apparatus, and compared with a reference image and reference positional information stored in the image recognition apparatus, so that displacement quantities $\Delta x$ and $\Delta y$ in the X and Y directions and an inclination quantity $\Delta \theta$ are computed, and bonding position correction of the whole of inner leads is performed on the basis of these quantities.

Further, a portion between a die-pad suspension lead and an inner lead is stamped out through two or more steps, so that it is possible to form a step portion having a corner portion which is sharp and which has no shear drop.

BRIEF DESCRIPTION OF THE DRAWINGS

Other features and advantages of the present invention will be apparent from the following description taken in connection with the accompanying drawings, wherein.

DETAILED DESCRIPTION OF THE PREFERRED EMBODIMENT

An embodiment of the present invention will be described with reference to the drawings.

Figure 1:
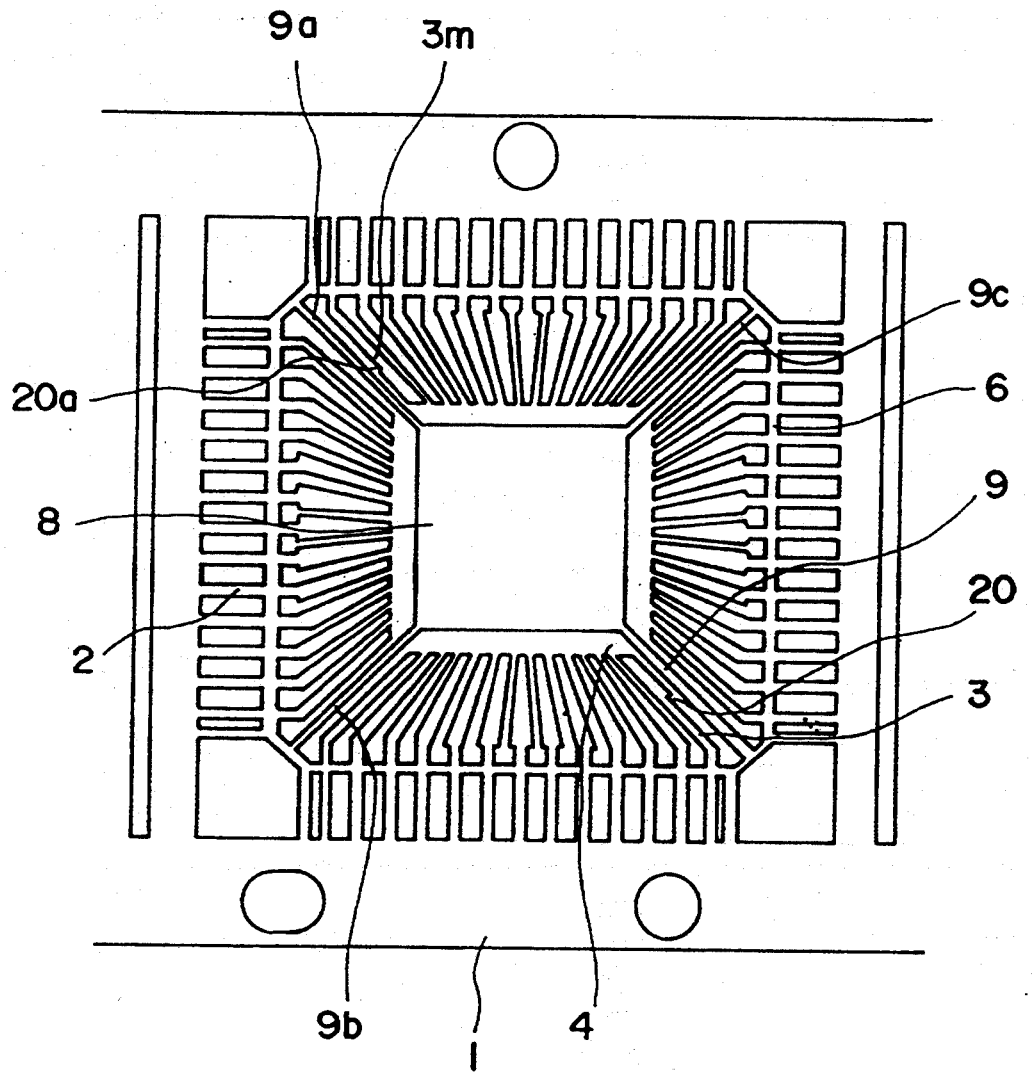
FIG. 1 is a plan view illustrating an embodiment of the integrated circuit lead frame according to the present invention.
Figure 2:
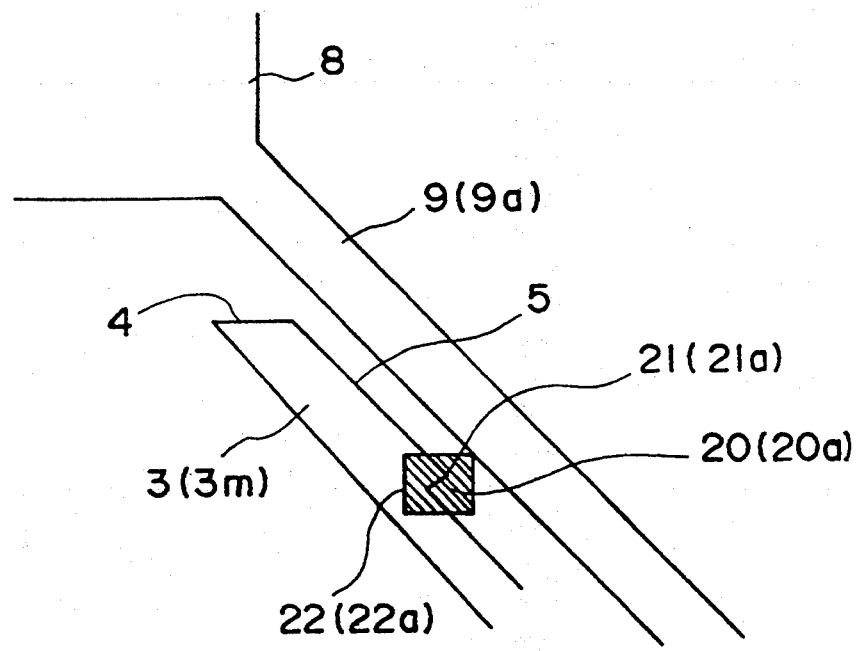
FIG. 2 is an enlarged view illustrating a main portion of FIG. 1.
Figure 11:
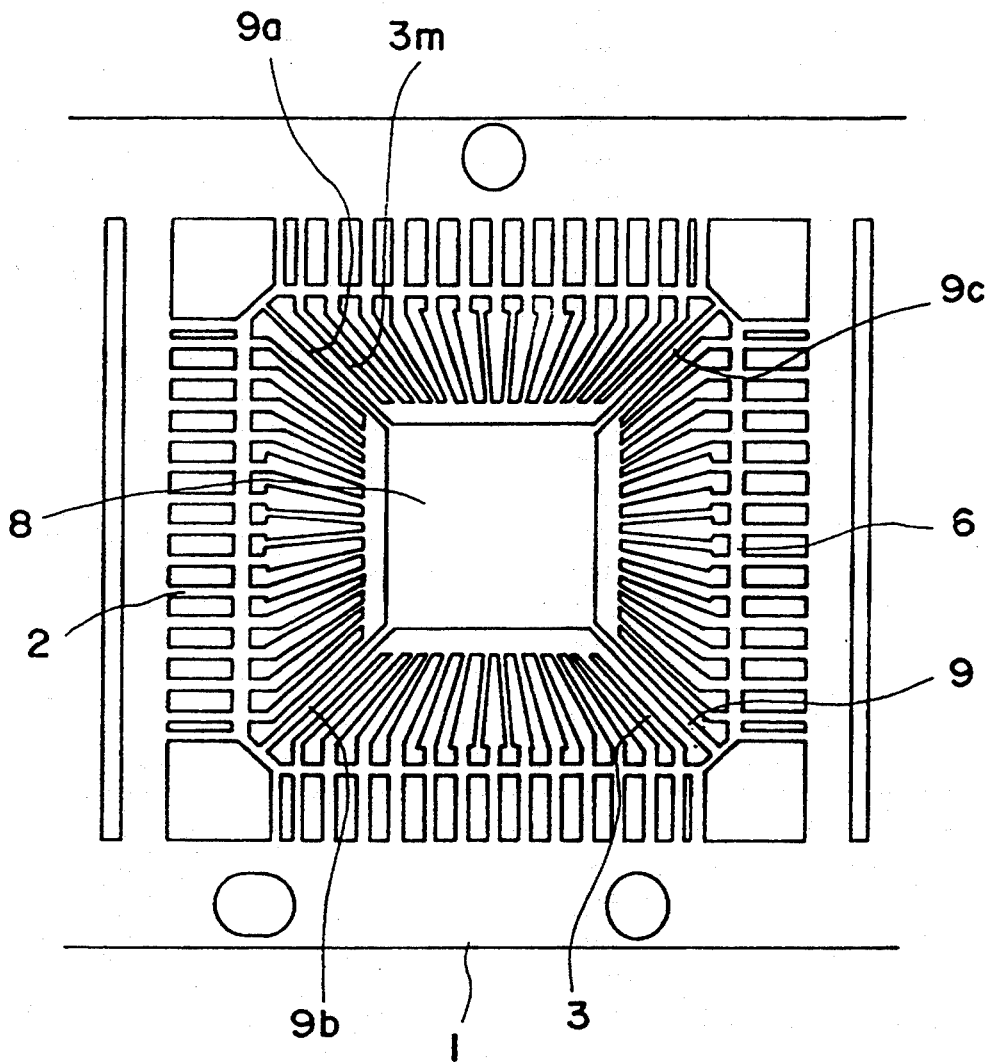
FIG. 11 is a plan view illustrating an example of a conventional integrated circuit lead frame.
Figure 12:
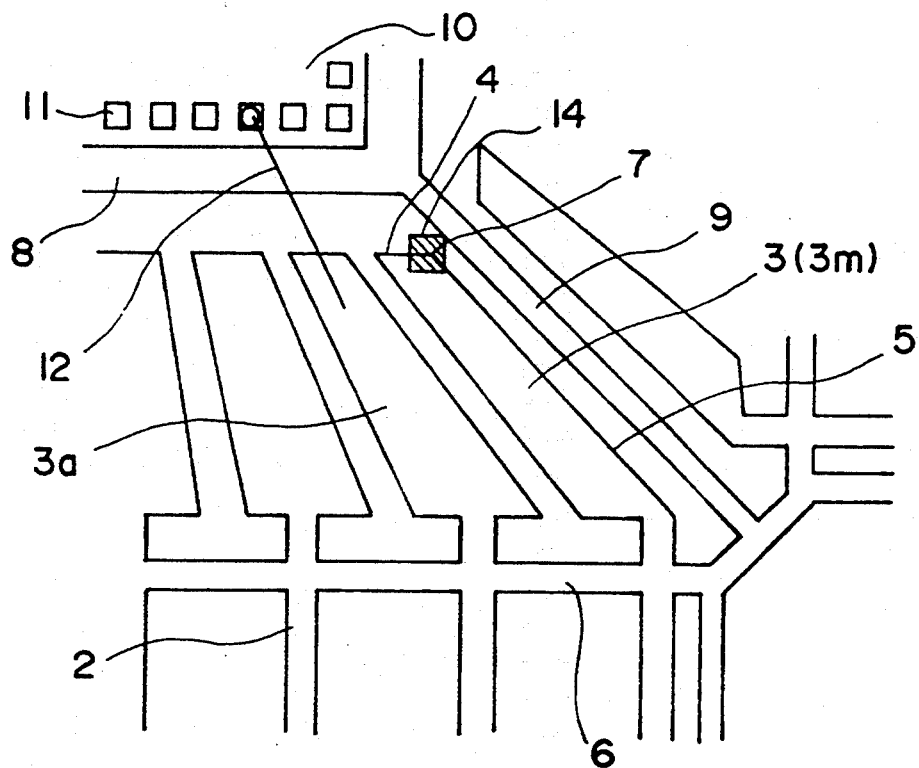
FIG. 12 is a view for explaining the operation of an example of the main portion of FIG. 11.
Figure 13:
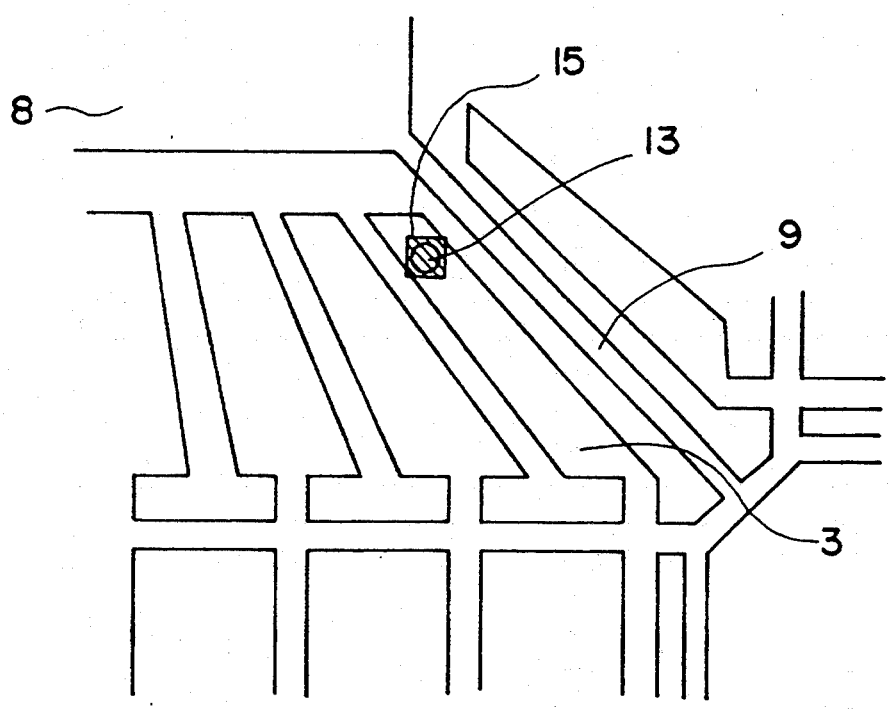
FIG. 13 is an enlarged view illustrating another example of the main portion of FIG. 11.
Figure 14:
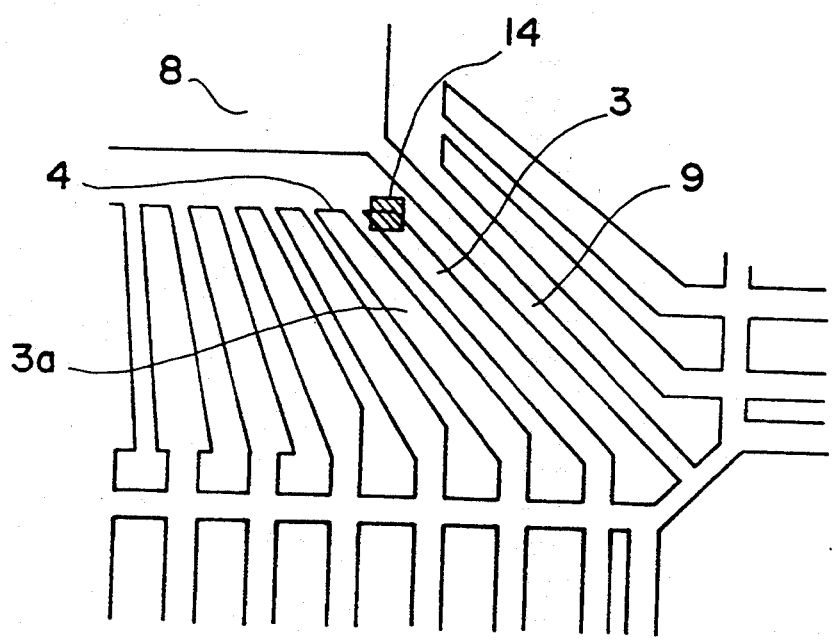
FIG. 14 is an enlarged view illustrating a main portion of a conventional integrated circuit lead frame have a large number of pins.
Figure 15:
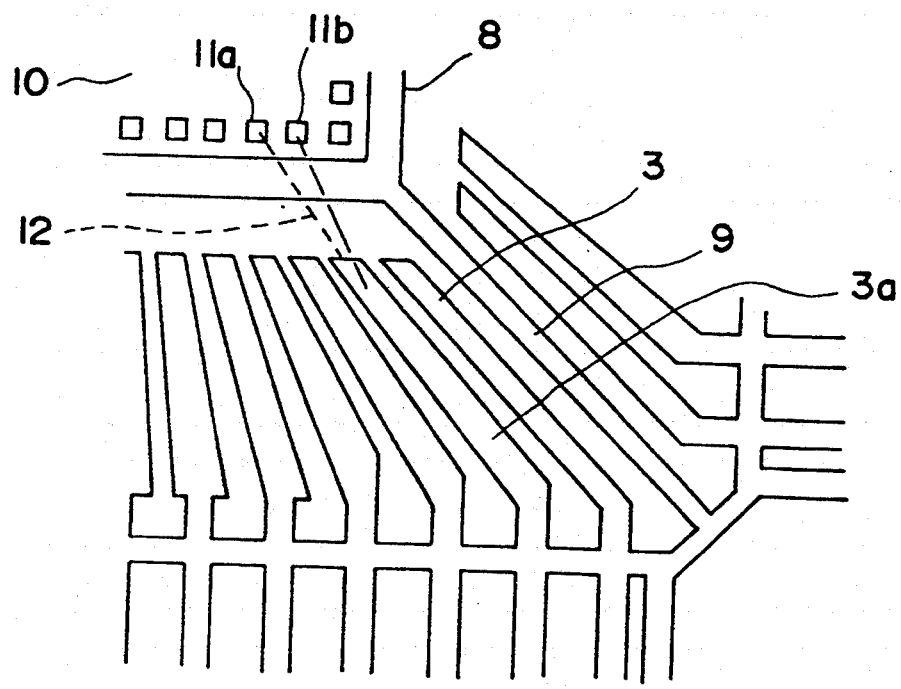
FIG. 15 is a view for explaining the operation of FIG. 14.

FIG. 1 is a plan view if an embodiment of the present invention, and FIG. 2 is an enlarged view of a main portion of FIG. 1. Parts the same as those in the conventional example described with respect to FIG. 11 are referenced correspondingly, and will not be described here.

In this embodiment, the pair of inner leads 3 and 3m adjacent to the pair of diagonally opposite die-pad suspension leads 9 and 9a for suspending the die-pad 8 are made to have substantially Z-shaped step portions 20 and 20a respectively in the die-pad suspension leads 9 and 9a between the respective top end portions 4 and the damper 6.

Figure 3:
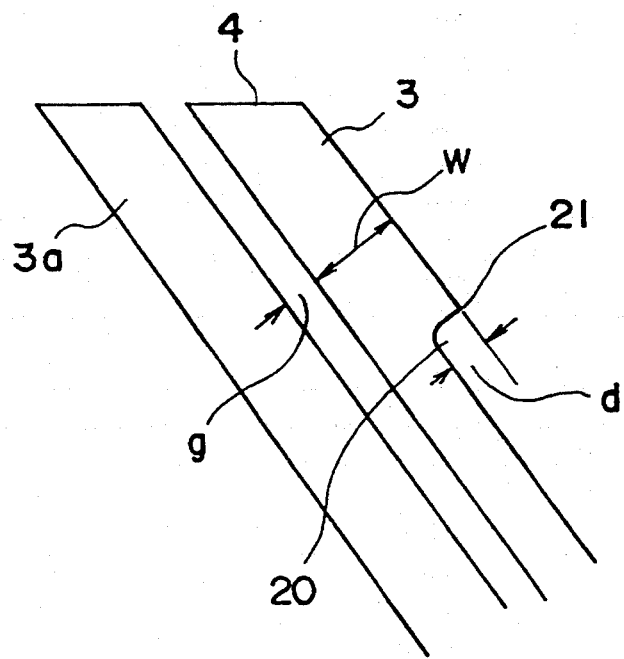
FIG. 3 is a detailed explanatory view of FIG. 2.

According to this embodiment, as shown in FIG. 3, the inner lead 3 having a thickness of 0.15 mm, a top end portion width W of 0.25 mm and a distance to the adjacent inner lead 3a of 0.1 mm was made to have a step portion 20 (20a) of a depth d of 0.1 mm, so that the corner portion 21 (21a) of the inner lead 3 was made sharp. The shape of this step portion 20 (20a) was recognized as an image (a hatched portion 22 (22a) shows an area having a shape to be stored as an image), and compared with a reference image and reference position information stored in an image recognition apparatus to thereby compute positional displacement quantities $\Delta x$ and $\Delta y$ in the X and Y directions and an inclination quantity $\Delta \theta$. Thus, bonding position correction was performed with respect to the whole of inner leads on the basis of the above quantities, and a good result could be obtained.

In the above description, although the two inner leads 3 and 3m which were adjacent to the die-pad suspension leads 9 and 9a and which were opposite to each other in the diagonal direction of the die-pad 8 were made to have the step portions 20 and 20a respectively in the die-pad suspension leads 9 and 9a to thereby perform positioning of the inner leads 3 by using an image recognition apparatus, the inner leads which are made to have the step portions 20 and 20a are not limited to the inner leads 3 and 3a which have been described above, but such step portions may be formed in any other inner leads. Further, the step portions 20 and 20a may be formed in the inner leads on their outer side far away from the respective die-pad suspension leads 9 and 9a.

Further, the provision of such a step portion 20 is not limited to two opposite inner leads, but such a step portion 20 may be provided in one or in each of three or more inner leads. In the case of providing such a step portion 20 in each of two or more inner leads, it is preferable to provide the step portion 20 in inner leads which are opposite to each other if possible.

In the above description, shown are cases in each of which the step portion is provided in the inner lead 3, such a step portion 20 may be provided in another position, for example, in the outer lead 2, in the damper 6, in the die-pad 8, in the die-pad suspension leads 9 to 9c, or the like. In short, it goes well if such a step portion 20 is provided on the lead frame 1.

As the method of producing a lead frame, there are two well-known methods, an etching method and stamping method. However, lead frames produced by the stamping method have been used broadly because of low cost, and the lead frame having a step portion according to the present invention is produced also by this stamping method. The method of producing the lead frame will be described under.

Figure 4:
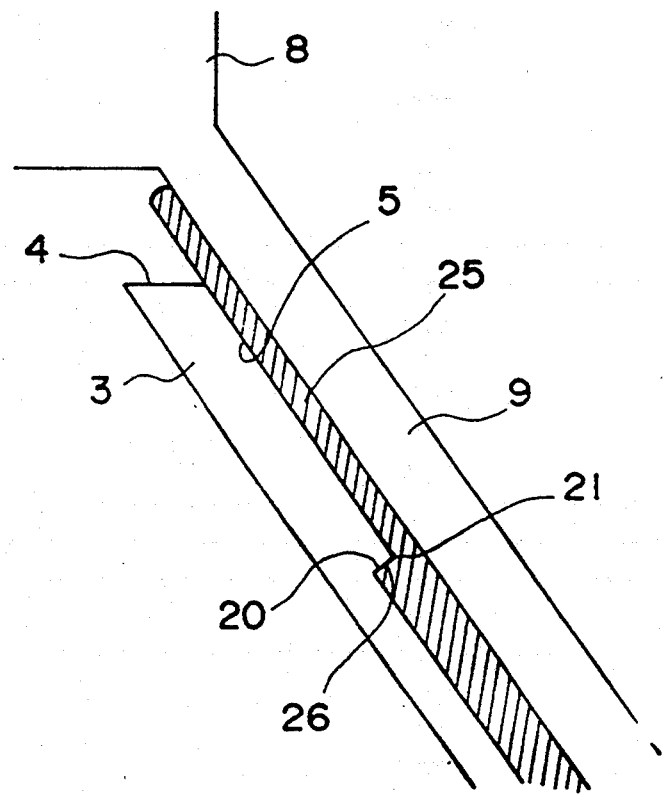
FIG. 4 is an explanatory view illustrating an example of a method of producing a step portion according to the present invention.
Figure 5:
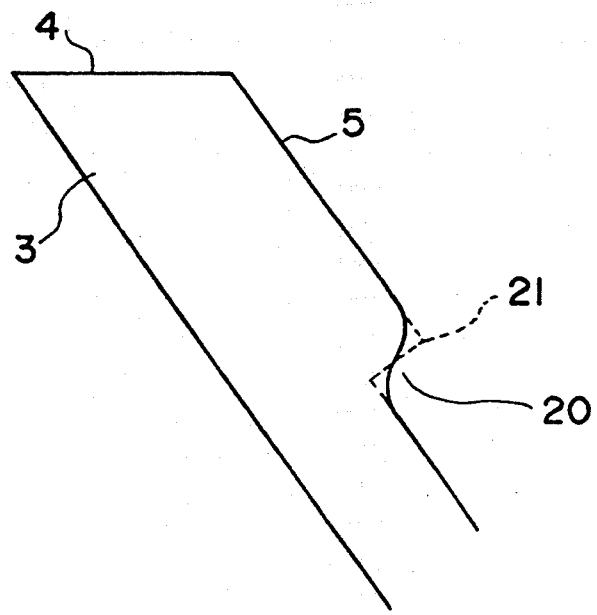
FIG. 5 is an enlarged view illustrating a main portion of FIG. 4.

FIG. 4 shows an example of the method of producing a lead frame, according to the present invention, particularly its step portion 20, according to the present invention. In this example, a portion between an inner lead 32 and a die-pad suspension lead 9 is stamped out, through one step, by means of a punch 25 having a step portion 26.

However, if stamping is carried out through one step by means of such a signal punch 25, an corner portion 21 of the step portion 20 becomes accurate so that the shape thereof is not stable. This is caused by abrasion of the punch 25 and a clearance between the punch 25 and a die (not-shown). In addition, in stamping by means of the punch 25, stress causes unstable shear drop or roll over at the corner portion 21 and edge portions near the corner portion 21.

Such an arcuate shape or shear drop produced at the corner portion 21 of the step portion 20 is apt to be judged different from a reference image or reference positional information stored in an image recognition apparatus, so that erroneous recognition or stoppage of operation of the apparatus may occur easily. It is therefore necessary to make the step portion 20 have the corner portion 21 which is sharp and has no shear drop.

FIGS. 6 to 10 show various embodiments of the method of producing a lead frame, particularly the step portion 20 formed in the inner lead 3, according to the present invention.

Figure 6:
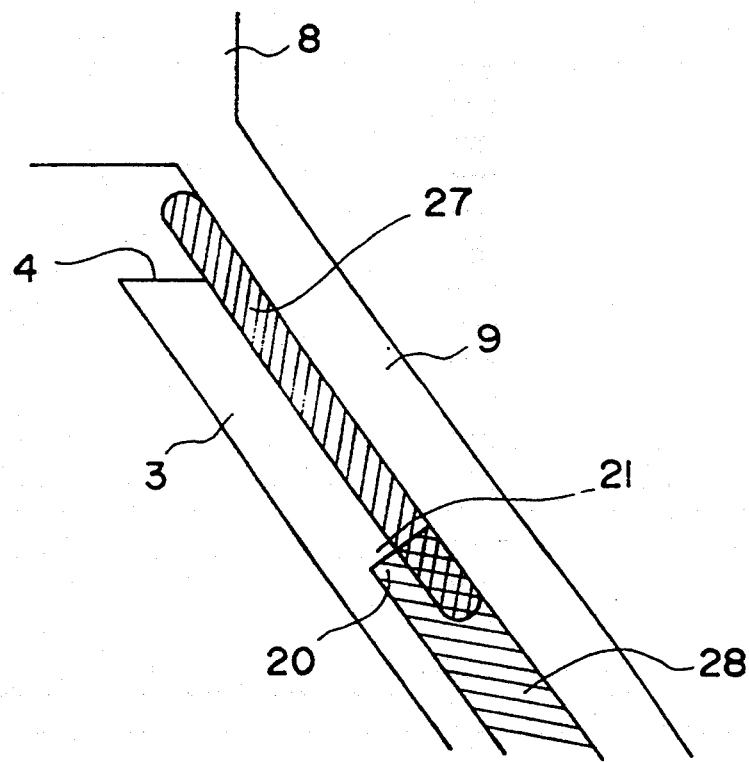
FIG. 6 is a view for explaining a first embodiment of the method of producing a step portion according to the present invention.

In the embodiment in FIG. 6, first the portion between the inner lead 3 and the die-pad suspension lead was stamped out on the die-pad 8 side by means of a first punch 27 having a length longer than the distance from the top end portion 4 of the inner lead 3 to the step portion 20 and having a width which agrees with the interval between the inner lead 3 and the die-pad suspension lead 9. Next, the portion between the inner lead 3 and the die-pad suspension lead 9 was stamped out on the damper 6 side by means of a second punch 28 wider then the first punch 27. Thus, the step portion 20 was formed through the two steps by means of the two kinds of punches 27 and 28.

Therefore, it was possible to obtain the step portion 20 having the corner portion 21 having a sharp and stable shape, and it was possible to reduce generator of shear drop, so that reproducibility could be improved conspicuously. While the bonding accuracy of the metal wire 12 with the inner lead 3 was ±25 μm in the case of the lead frames produced by the method of producing in FIG. 4, the bonding accuracy was ±12 μm in the lead frames produced by this embodiment. Thus, the bonding accuracy could be improved conspicuously.

Figure 7:
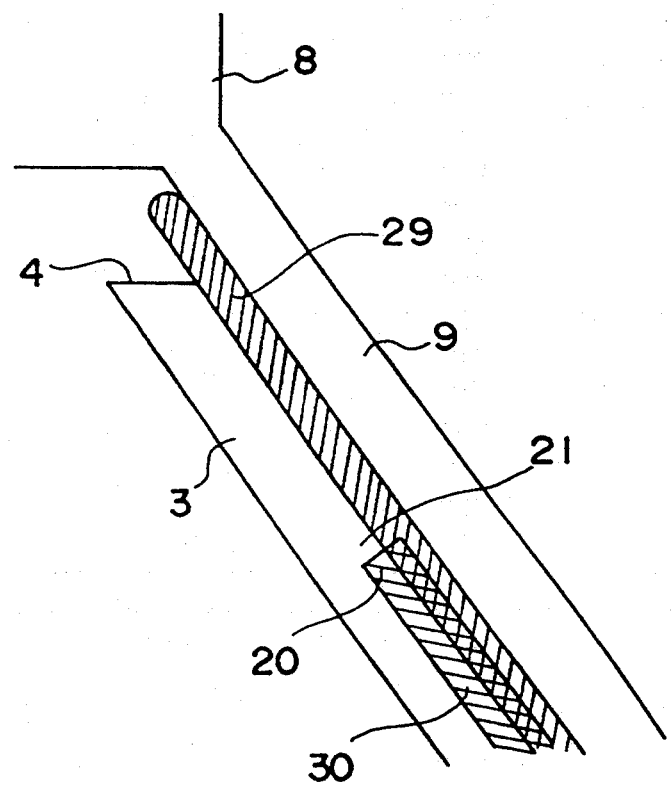
FIG. 7 is a view for explanation a second embodiment of the method of producing a step portion according to the present invention.

In the embodiment in FIG. 7, first the portion between the inner lead 3 and the die-pad suspension lead 9 was stamped out by means of a third punch 29 having a width which agrees with the interval between the leads 3 and 9, and next the portion between the step portion 20 and the damper 6 was stamped out by means of a fourth punch 30 to thereby form the step portion 20 having the corner portion 21 which is Sharp and which has no shear drop.

Figure 8:
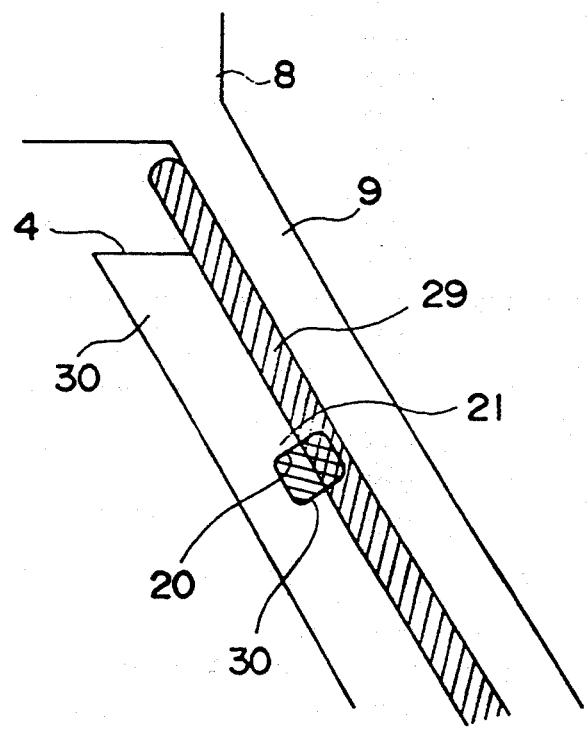
FIG. 8 is a view for explaining a third embodiment I of the method of producing a step portion according to the present invention.

In the embodiment if FIG. 8, in the same manner as the case of FIG. 7, first the portion between the inner lead 3 and the die-pad suspension lead 9 was stamped out by means of the third punch 29, and next the portion between the top end portion 4 of the inner lead 3 and the damper 6 was stamped out by means of a fifth punch 31 to thereby form the step portion 20 having a concave portion.

Figures 9, 10:
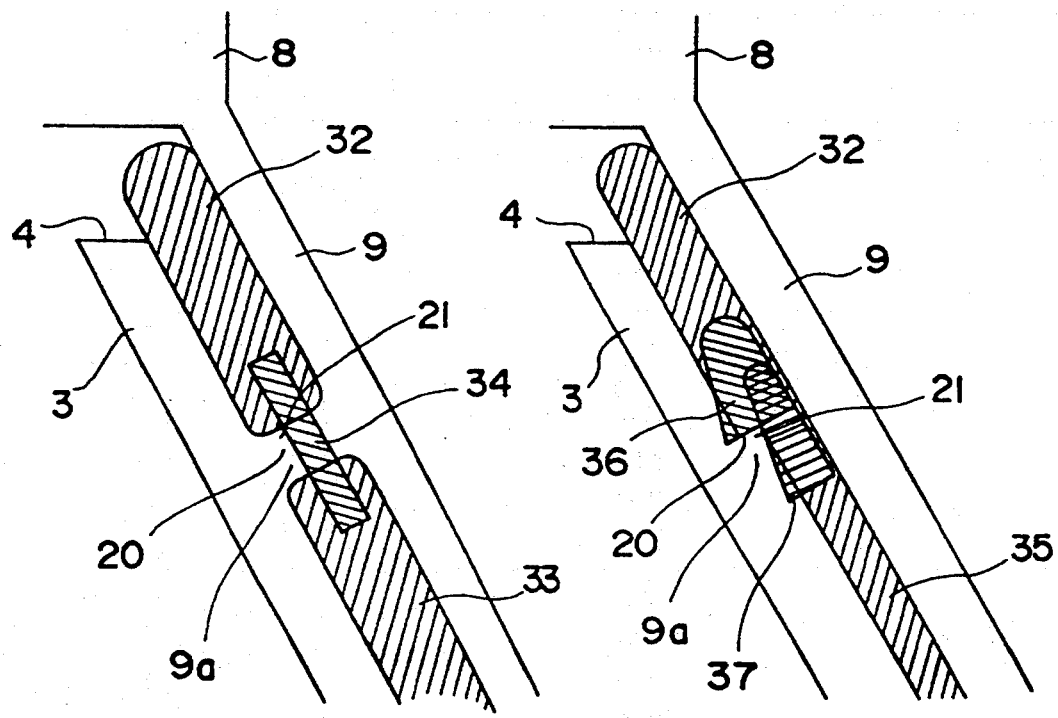
FIG. 9 is a view for explaining a fourth embodiment of the method of producing a step portion according to the present invention.
FIG. 10 is a view for explaining a fifth embodiment of the method of producing a step portion according to the present invention.

In the embodiment in FIG. 9, the portion between the inner lead 3 and the die-pad suspension lead 9 was stamped out by means of slightly wider sixth and seventh punches 32 and 33 to leave a bridge portion 9a connecting the inner lead 3 with the die-pad suspension lead 9, and next a substantially center portion of the bridge portion 9a is stamped out by means of an eighth punch 34 narrower than the sixth and seventh punches 32 and 33 to thereby form the step portion 20 projecting on the die-pad suspension lead 9 side.

At this time, stamping may be made by using a single punch having a concave portion in its intermediate portion, in place of using the two sixth and seventh punches 32 and 33 to thereby form the bridge portion 9a.

In the embodiment in FIG. 10, the portion between the inner lead 3 and the die-pad suspension lead 9 was stamped out by means of the sixth punch 32 as described in FIG. 9 and a ninth punch 35 having a width which agrees with the interval between the leads 3 and 9 while leaving the bridge portion 9a, and next the bridge portion 9a was stamped out on the die-pad 8 side by means of a substantially trapezoidal tenth punch 36. Last the rest portion of the bridge portion 9a is stamped out by means of a substantially trapezoidal eleventh punch 37 smaller than the tenth punch 36 to thereby form the step portion 20 having the arcuate corner portion 21.

Although the embodiments of the method of producing a step portion of a lead frame according to the present invention have been described, the present invention is not limited to those embodiments. In short, it goes well if a step portion having a corner which is sharp and which has no shear drop can be formed by stamping through two or more steps by using two or more punches.

As is apparent from the above description, according to the present invention, a step portion having a sharp corner portion is provided in a lead frame, so that an image recognition apparatus can accurately recognize the shape of a portion to be bonded and perform positional correction in bonding a lead frame having a number of pins. It is therefore possible to prevent generation of faults such as a large positional displacement in wire bonding, and at the same time it is possible to shorten recognition time by a worker and a bonding device, that is, the time for producing a lead frame, so that it is possible to improve the working efficiency.

In addition, since a step portion is produced through two or more steps, it is possible to form a step portion having a corner portion which is sharp and which has no shear drop, and it is therefore possible for an image recognition apparatus to recognize the step portion accurately and rapidly, so that the recognition can be made in no error.

In the embodiments of from the first embodiment shown in FIG. 6 to the fifth embodiment shown in FIG. 10, an integrated circuit lead frame 1 which has pilot holes P, a die-pad 8, inner leads 3 including suspension leads 9, and outer leads 2, is formed by stamping before a step portion 20 having a sharp corner portion is formed in at least one of the inner leads 3 by stamping through 2–4 steps by using 2–4 punches.

Figure 20:
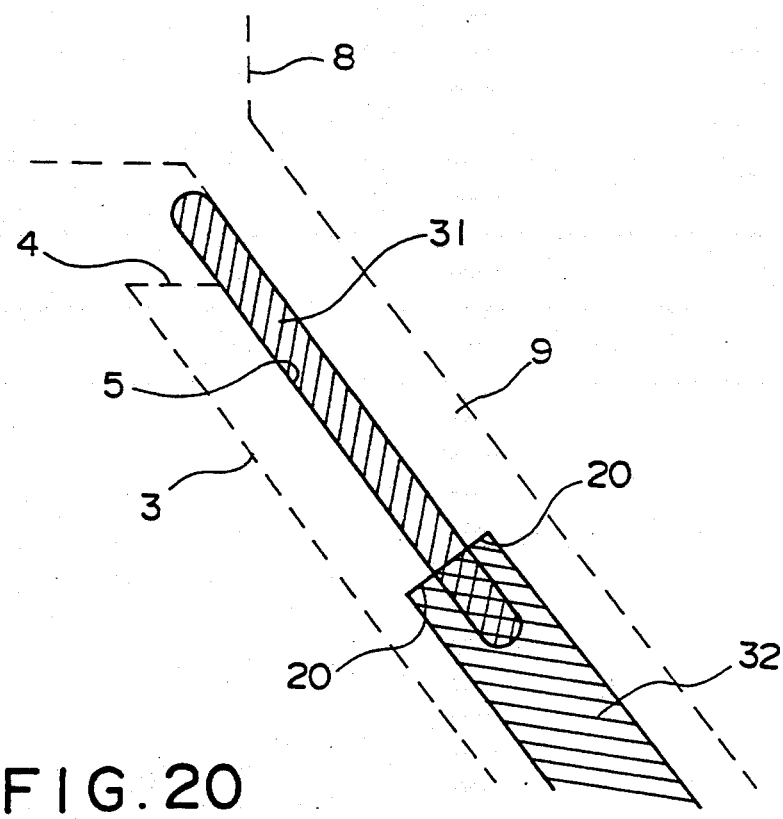
FIG. 20 is an explanatory view of a sixth embodiment of the method of producing a step portion according to the present invention.
Figure 22:
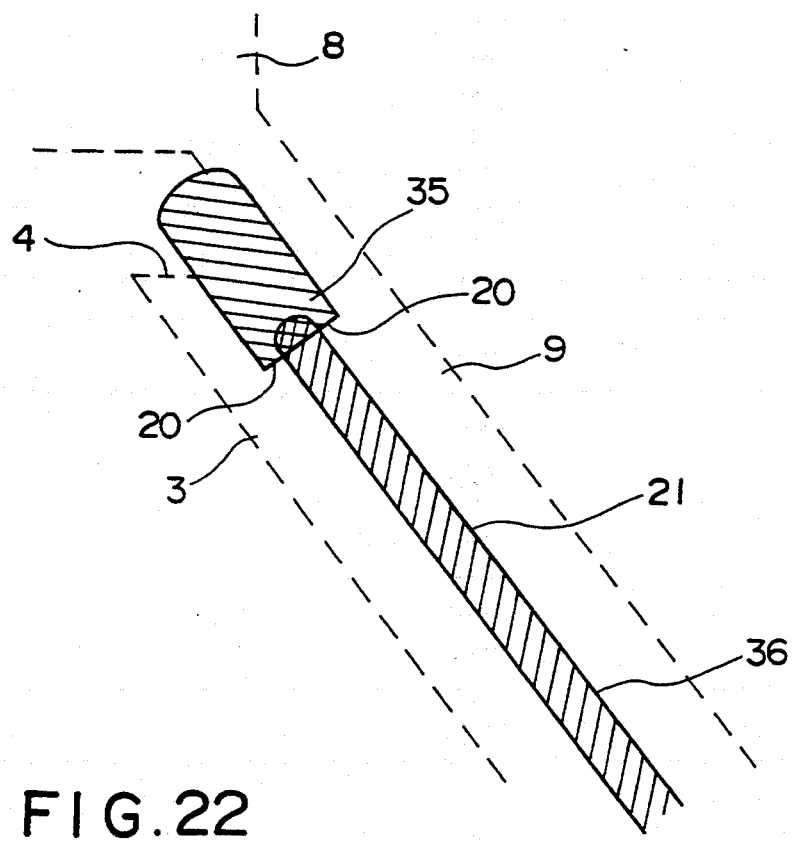
FIG. 22 is an explanatory view of an eighth embodiment of the method of producing a step portion according to the present invention.

On the contrary, in the embodiments of from the sixth embodiment shown in FIG. 20 to the eighth embodiment shown in FIG. 22, in a frame stamping step in which pilot holes P, outer leads 2, inner leads 3 containing suspension leads 9, and a die-pad 8 are formed in a metal thin film 100a by stamping by means of a punch to thereby form a lead frame 1, a Z-shaped step portion 20 having a sharp corner portion is formed, simultaneously with the formation of the inner leads 3, in at least one of the inner leads 3 by stamping by means of another mismatched punch different from the punch for forming the inner leads 3.

Before the embodiments of formation of a Z-shaped step portion 20 having a sharp corner portion in at least one of the inner leads 3 are described, stamping in the frame stamping step for production of a lead frame 1 will be described below with reference to FIGS. 16 through 19.

Figure 16:
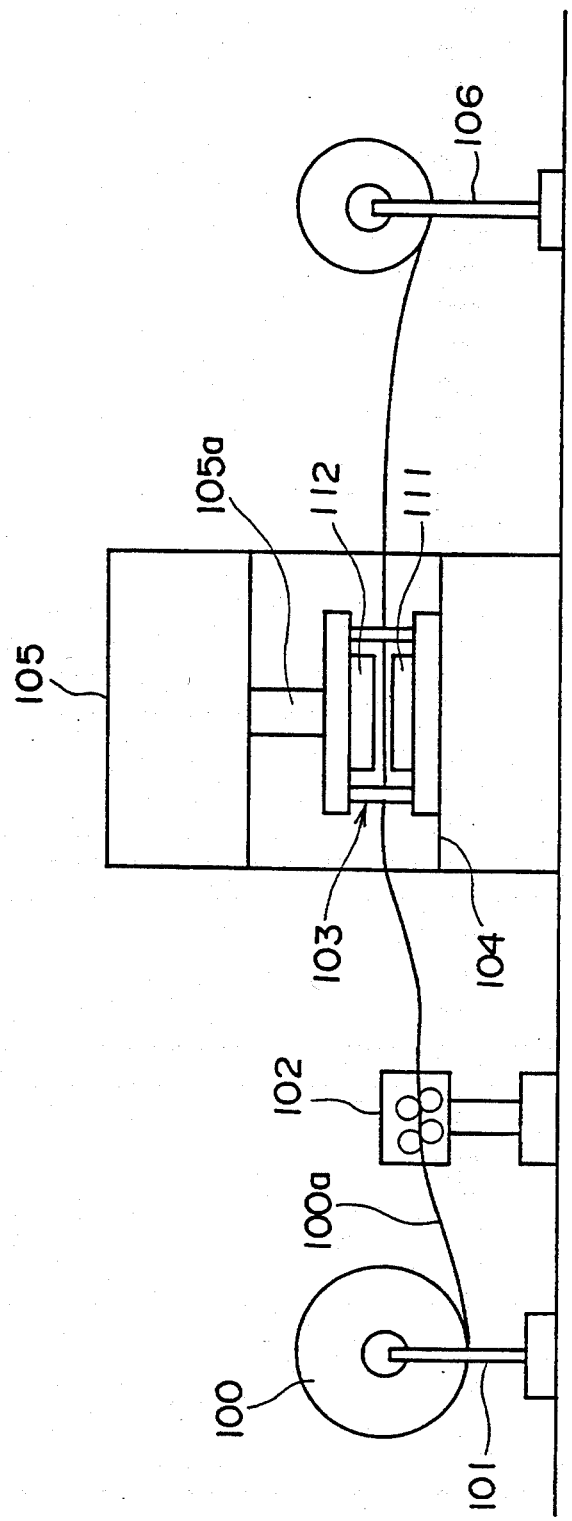
FIG. 16 is an explanatory view showing the outline of a stamping equipment used for production of an integrated circuit lead frame according to the present invention.

FIG. 16 shows a frame stamping equipment for production of a lead frame 1.

In FIG. 16, the reference numeral 100 designates a metal roll wound with a thin metal plate 100a obtained by slitting a metal material such as a 42 alloy, a Cu alloy or the like so as to have a predetermined width, for example, of 50 mm and a thickness of 0.127 mm; 101, a roll output stand for rotatably supporting the metal roll 100; 102, a tension leveler for straightening the thin metal plate 100a rewound from the metal roll 100; and 103, a die assembly for performing stamping onto the straightened thin metal plate 100a to thereby produce a lead frame. The die assembly 103 is mounted on a base 104 of a press 105. An up/down driving portion 105a of the press 105 is connected to an upper portion of the die assembly 103 mounted on the base 104. The reference numeral 106 designates a roll takeup stand for taking up the stamped thin metal plate 100a.

Figure 17A:
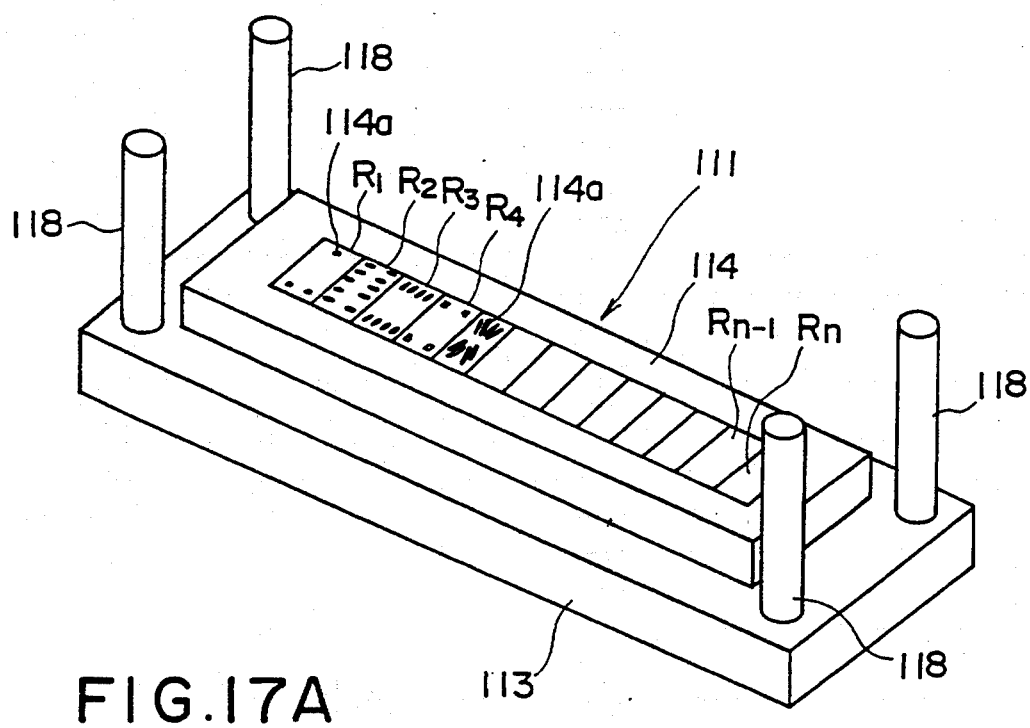
FIG. 17A is a perspective view showing a lower die part of a die assembly used for stamping.
Figure 17B:
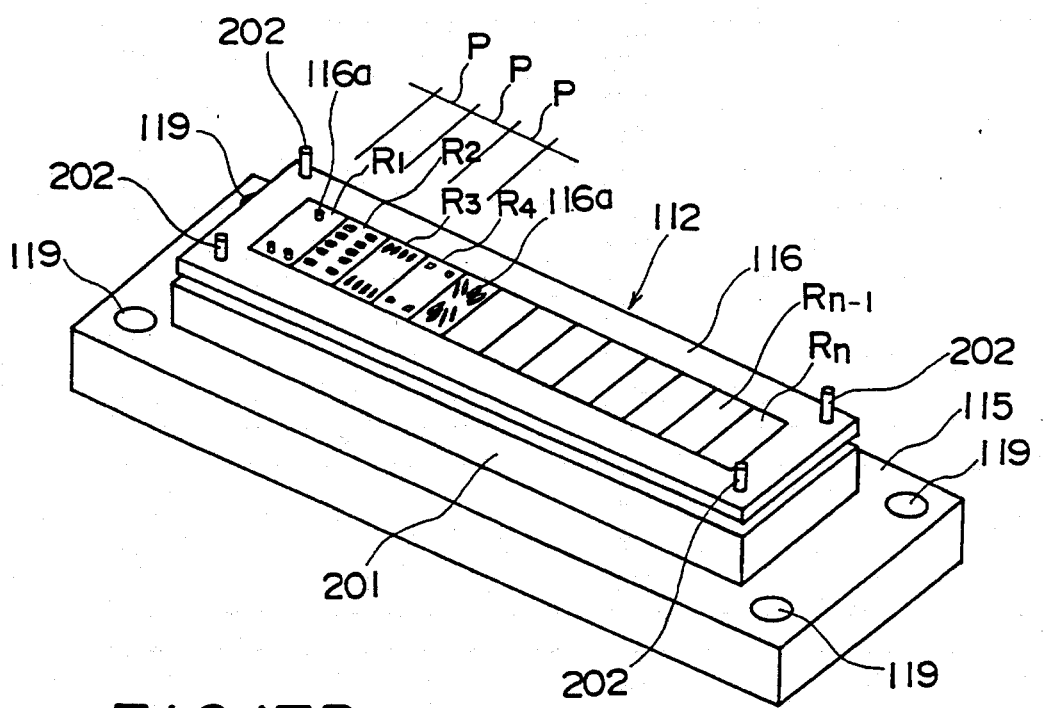
FIG. 17B is a perspective view showing an upper die part of the die assembly used for stamping.

FIGS. 17A and 17B show the structure of lower and upper die parts of the die assembly for performing stamping to thereby produce a lead frame 1.

The die assembly 103 is constituted by a lower die part 111 and an upper die part 112. The lower die part 111 has a lower die-set 113, and a die-plate 114 fixed onto an upper surface of the lower die-set 113. The upper die part 112 has an upper die-set 115, and a stripper plate 116 limited by set posts 202 and vertically movably mounted onto a lower surface of a punch plate 201 of the upper die-set 115 and separated from the lower surface of the punch plate 201 at a predetermined distance kept by springs 117. Guide holes 119 provided at four corners of the upper die-set 115 are fitted onto guide posts 118 erected at four corners of the lower die-set 113, so that the upper die part 112 is vertically movably mounted on the lower die part 111. The upper die part 112 is made to move up/down by the press 5.

A plurality of regions R1 to Rn separated at intervals of a pitch for stamping the pilot holes, the outer leads, the inner leads, the die-pad and so on individually are provided in the die-plate 114 of the lower die part 111. A plurality of stamping holes 114a exclusively used for the individual stamping are formed in each of the regions. A plurality of regions R1 to Rn separated at intervals of a pitch for stamping the pilot holes, the outer leads, the inner leads, the die-pad and so on individually are also provided in the punch plate 201 and stripper plate 116 of the upper die part 112. A plurality of punches 116a exclusively used for the individual stamping are formed in each of the regions of the punch plate 201.

Figure 18A:
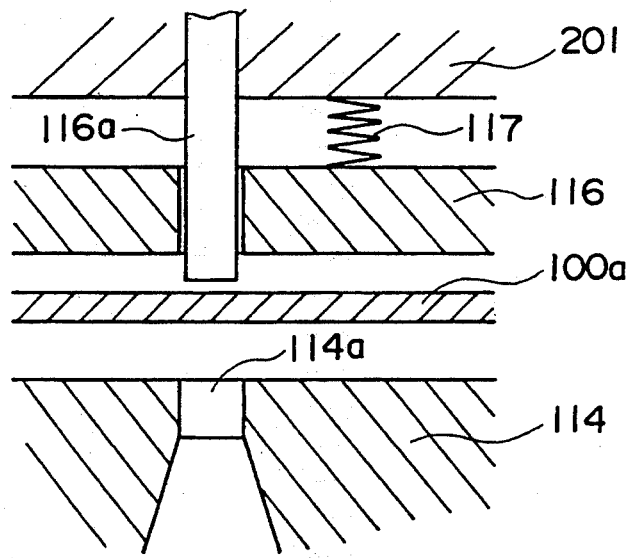
FIG. 18A is an explanatory view showing a stamping step using the upper and lower die parts of the die assembly.
Figure 18B:
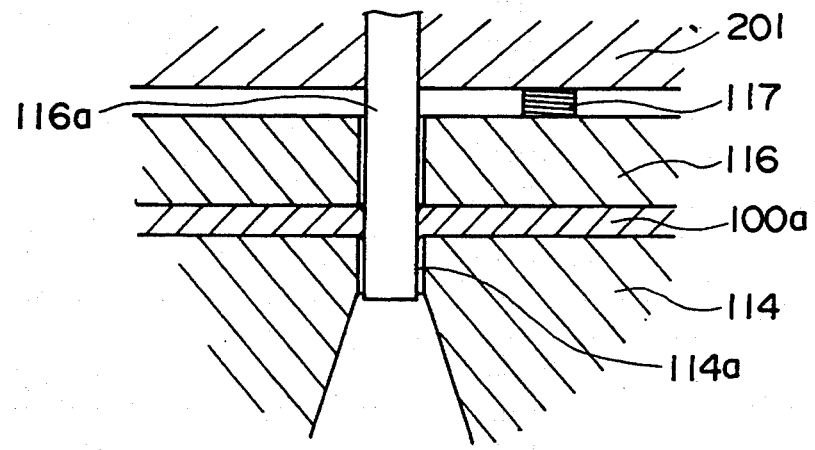
FIG. 18B is an explanatory view showing a stamping step using the upper and lower die parts of the die assembly.
Figure 18C:
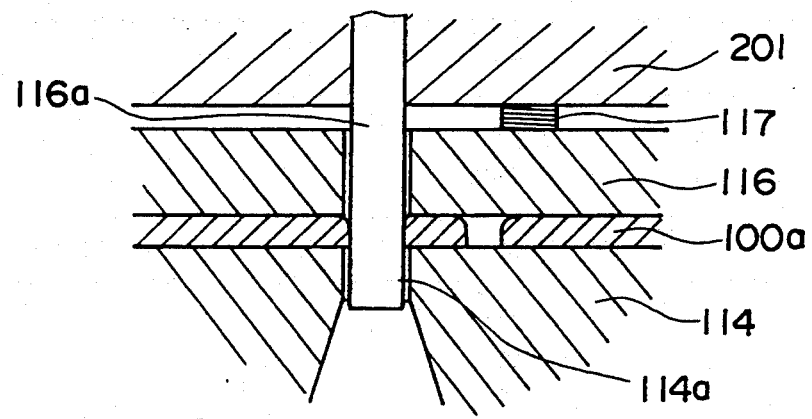
FIG. 18C is an explanatory view showing a stamping step using the upper and lower die parts of the die assembly.

FIGS. 18A to 18C show a stamping step using the upper and lower die parts of the die assembly. FIG. 18A shows the case where the thin metal plate 100a rewound from the metal roll 100 is placed between the die-plate 114 of the lower die part 111 and the stripper plate 116 of the upper die part 112. FIG. 18B shows the case where the upper die part 112 descends with the descending of the up/down driving portion 105a of the press 105 so that the punch 116a passes through the thin metal plate 100a and enters into the stamping hole 114a to thereby stamp the thin metal plate 100a. In this case, the clearance between the punch 116a and the stamping hole 114a is in a range of about 4 to about 8 $\mu$m. FIG. 18C shows the case where after stamping is performed in one region of the thin metal plate 100a, the punch 116a enters into the stamping hole 114a to thereby perform stamping in another region.

Figure 19:
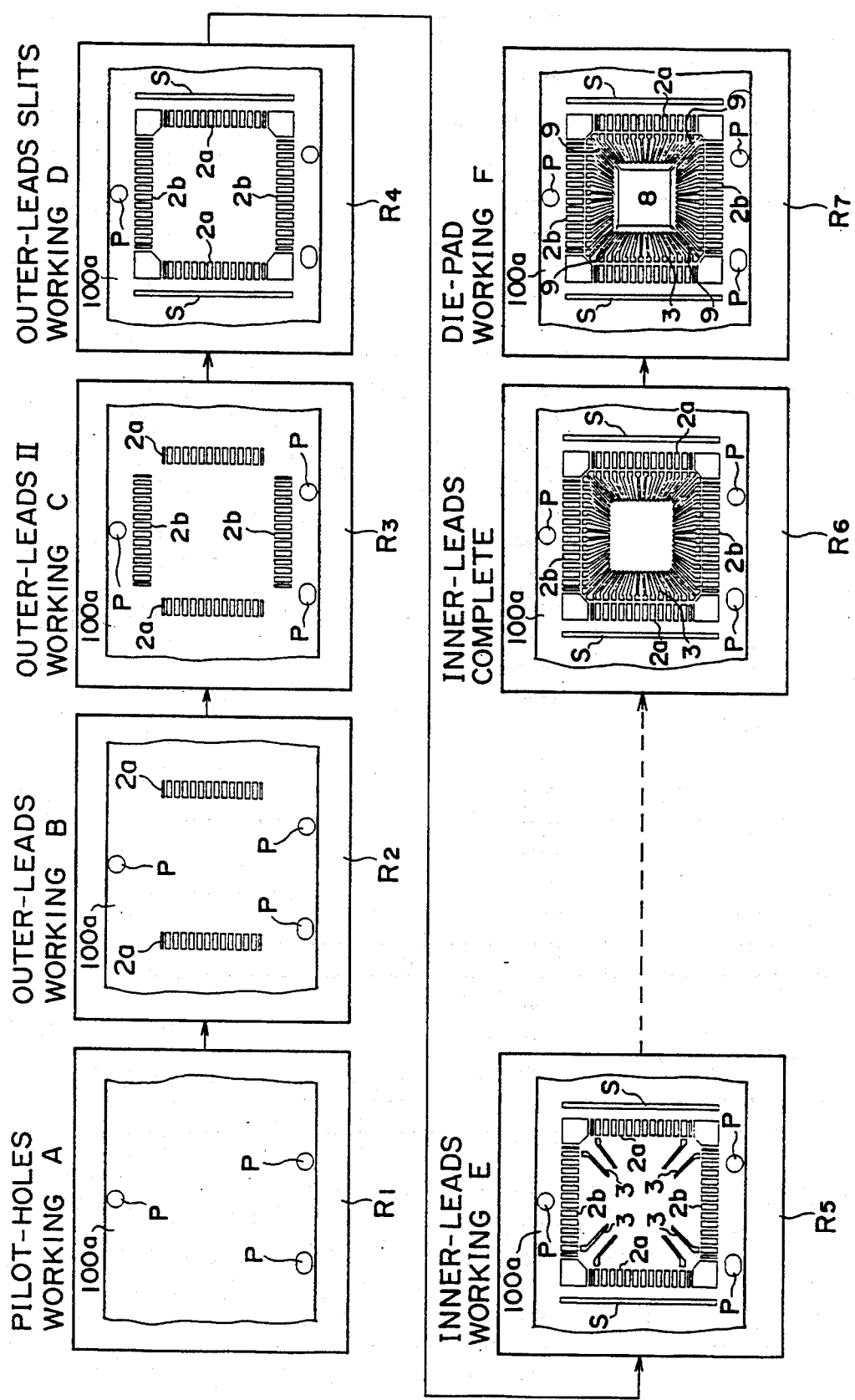
FIG. 19 is a view showing steps of a stamping sequence for production of an integrated circuit lead frame.

FIG. 19 shows a sequence of stamping to form an integrated circuit lead frame 1 by stamping working.

In the stamping sequence shown in FIG. 19, first, a forward end portion of the thin metal plate 100a is fed to the first stamping region R1 where stamping starts, so that pilot holes P are formed by stamping by means of punches 116a and stamping holes 114a in the first region R1.

Then, the forward end portion having the pilot holes P formed is fed to the next, second region R2, so that outer leads I 2a are formed by stamping by using punches 116a and stamping holes 114a in the second region R2. Then, the forward end portion having the pilot holes P and outer leads I 2a formed is fed to the third region R3, so that outer leads II 2b are formed by stamping by means of punches 116a and stamping holes 114a in the third region R3.

Then, the forward end portion having the pilot holes P, outer leads I 2a and outer leads II 2b formed is fed to the fourth region R4, so that outer lead slits S are formed by stamping by means of punches 116a and stamping holes 114a in the fourth region R4.

Then, the forward end portion having the pilot holes P, outer leads I 2a, outer leads I 2b and outer lead slits S formed is fed to the fifth region R5, so that inner leads 3 are formed by stamping by means of punches 116a and stamping holes 114a in the fifth region R5. Because the number of inner leads 3 is large, the fifth region R5 is divided into a plurality of subregions so that the inner leads 3 are formed by stamping in the plurality of subregions. Assuming now that, for example, eight punches 116a per one region are used and that 256 inner leads 3 are to be formed, then the fifth region R5 is divided into 32 sub-regions.

After the inner leads 3 are thus formed by stamping, the forward end portion having the pilot holes P, outer leads I 2a, outer leads I 2b, outer lead slits S and inner leads 3 formed is fed to the sixth region R6, so that a die-pad 8 is formed by stamping by means of punches 116a and stamping holes 114a in the sixth region R6 to thereby form a lead frame 1. Inner leads 3 on diagonal lines of the die-pad 8 at the time of the formation of the die-pad 8 are formed as suspension leads 9.

For example, in the inner lead 3 forming step in the frame stamping step for producing a lead frame 1, a Z-shaped step portion 20 having a sharp corner portion is formed, simultaneously with the formation of the inner leads 3, in at least one of inner leads 3 by stamping by means of other mismatched punches than the punches for forming the inner leads 3.

In the sixth embodiment shown in FIG. 20, Z-shaped step portions 20 each having a sharp corner portion are formed, simultaneously with the formation of the inner leads 3 in the frame stamping step, not only in side portions of inner leads 3 adjacent to suspension leads 9 which are formed diagonally so as to be opposite to each other with respect to the die-pad 8 and but also in side portions of the suspension leads 9, respectively.

In this embodiment, the two Z-shaped step portions 20 are formed by stamping by means of a first punch 31 and a second punch 32. The first punch 31 has a width matched with the distance between a suspension lead 9 to be formed and an inner lead 3 adjacent to the suspension lead 9, is located in the distance and has a length slightly larger than the length of from an forwarded end 4 of the inner lead 3 to the step portion to be formed. The second punch 32 has a width larger than the width of the first punch 31, has one side located in a side portion of the suspension lead 9 and another, opposite side located in a side portion 5 of the inner lead 3 opposite to the side portion of the suspension lead 9 and has a length equal to the length of from the step portion 20 to be formed in the inner lead 3 to a base end portion of the inner lead 3.

In this embodiment, the Z-shaped step portion 20 to be formed in the side portion of the inner lead 3 opposite to the side portion of the suspension lead 9 is provided in an inner position with respect to the forward end 4 of the inner lead 3. This is because the width of the inner lead 3 is no larger than 0.1 mm so that the portion of the forward end 4 forms a bonding area to thereby make it impossible to form the step portion 20 near the forward end 4. That is, this is because it is undesirable that the step portion is formed to narrow the portion of the forward end 4 any more. Assuming now that the width of the inner lead 3 is 0.1 mm, then the step portion 20 is formed in a range of from a position 0.6 mm distant from the forward end 4 of the inner lead 3 to a position 1.0 mm distant therefrom because a range of from the forward end 4 of the inner lead 3 to a position 0.5 mm distant from the forward end 4 is required as a boding area in practical use.

In this embodiment, the Z-shaped step portion 20 is provided in the side portion 5 of the inner lead 3 opposite to the side portion of the suspension lead 9, that is, step portions 20 are provided in positions which are located on diagonal lines so as to be opposite to each other with respect to the die-pad 8, so that an image recognizer can make recognition easily with respect to an inclined image. It is however a matter of course that the image recognizer can recognize positional displacement even in the case where Z-shaped step portions 20 are provided in other inner leads 3 than the inner leads 3 adjacent to the suspension leads 9.

Figure 21:
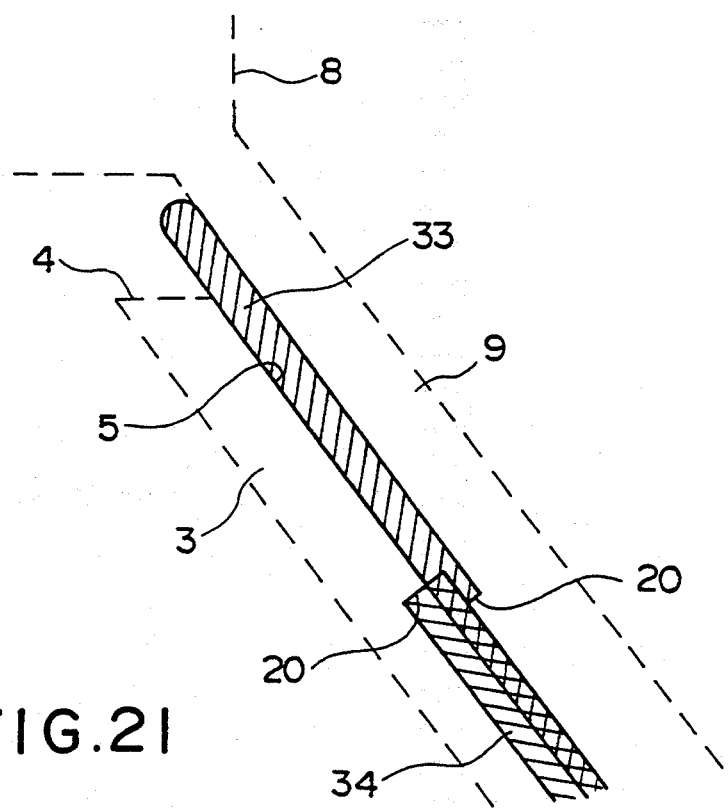
FIG. 21 is an explanatory view of a seventh embodiment of the method of producing a step portion according to the present invention.

In the seventh embodiment shown in FIG. 21, Z-shaped step portions 20 each having a sharp corner portion are formed, simultaneously with the formation of the inner leads 3 in the frame stamping step, not only in side portions 5 of inner leads 3 adjacent to suspension leads 9 which are formed on diagonal lines so as to be opposite to each other with respect to the die-pad 8, but also in side portions of the suspension leads 9.

In this embodiment, the two Z-shaped step portions 20 are formed by stamping by means of a first punch 33 and a second punch 34. The first punch 33 has a width matched with the distance between a suspension lead 9 to be formed and an inner lead 3 adjacent to the suspension lead 9, is located in the distance, and has a length slightly larger than the length of from an forward end 4 of the inner lead 3 to the step portion 20 to be formed. The second punch 34 has a width larger than the width of the first punch 33, has one side located in a side portion 5 of the inner lead 3 adjacent to the suspension lead 9 and opposite to the suspension lead 9, and has a length equal to the length of from the step portion 20 to be formed in the inner lead 3 to a base end portion of the inner lead 3.

In the eighth embodiment shown in FIG. 22, Z-shaped step portions each having a sharp corner portion are formed, simultaneously with the formation of the inner leads in the frame stamping step, not only in side portions of inner leads adjacent to suspension leads which are to be formed on diagonal lines so as to be opposite to each other with respect to the die-pad, but also in side portions of the suspension leads.

In this embodiment, the two Z-shaped step portions 20 are formed by stamping by means a first punch 35 and a second punch 36. The first punch 35 has a width larger than the width matched with the distance between a suspension lead 9 to be formed and an inner lead 3 adjacent to the suspension lead 9, is located in the distance, and has a length equal to the length of from an forward end 4 of the inner lead 3 to the step portion 20 to be formed. The second punch 36 has a width matched with the distance between the suspension lead 9 to be formed and the inner lead 3 adjacent to the suspension lead 9, has an forward end portion located within the width of the first punch 35 and in the distance between the suspension lead 9 and the inner lead 3 adjacent to the suspension lead 9, and has a length equal to the length of from the step portion 20 to be formed in the inner lead 3 to a base end portion of the inner lead 3.

Although the third embodiment in FIG. 8 has shown the case where a concave portion having Z-shaped step portions 20 is formed in a side portion 5 of an inner lead 3 adjacent to a suspension lead 9 after the production of a lead frame 1, the invention can be applied to the case where a concave portion 30 having Z-shaped step portions 20 is formed in a side portion 5 of an inner lead 3 adjacent to a suspension lead 9 simultaneously with the formation of the inner lead 3 in the frame stamping step in the same manner as in the embodiments of from the sixth embodiment to the eighth embodiment shown in FIGS. 20 to 22.

In that case, a concave portion 30 having Z-shaped portions 20 may be formed by stamping by means of a first punch which has a width matched with the distance between a suspension lead 9 to be formed and an inner lead 3 adjacent to the suspension lead 9, which is located in the distance, and which has a length equal to the length of from an forward end 4 of the inner lead 3 to a base end portion of the inner lead 3, and a second punch which is shaped like a quadrangle in section, and which has one side half located in a side portion 5 of the inner lead 3 adjacent to the suspension lead 9 and opposite to the suspension lead 9 and the other opposite side half located in the distance between the suspension lead 9 and the inner lead 3 adjacent to the suspension lead 9.

Although the respective embodiments of FIGS. 20 to 22 have shown the case where a Z-shaped step portion 20 having a sharp corner portion is formed, simultaneously with the formation of inner leads 3 in the frame stamping process, in an inner lead 3 adjacent to a suspension lead 9 to be formed, it is a matter of course that step portions 20 or notch portions having sharp corner portions equivalent to the step portions 20 may be formed in suspension leads 9, outer leads 2, a die-pad 8 and pilot holes P respectively as well as the inner leads 3 simultaneously with the formation of those parts.

Although the embodiments in FIGS. 20 to 22 have shown the case where pilot holes P, outer leads 2, inner leads 3 including suspension leads 9 and a die-pad 8 are formed successively in the above order by stamping by means of punches in the frame stamping step to thereby produce a lead frame 1, it is a matter of course that those constituent elements of a lead frame 1 may be formed in another arbitrary order than the aforementioned order to thereby produce the lead frame 1.

What is claimed is:

1. A method of producing an integrated circuit lead frame having a plurality of pilot holes, a die-pad onto which an integrated circuit chip is to be fixed, a plurality of suspension leads for supporting said die-pad, a number of inner leads provided around said die-pad so as to be separated from said die-pad at a predetermined distance, and connected through wires to electrodes of said integrated circuit chip fixed onto said die-pad, and a number of outer leads corresponding to said number of inner leads, said method comprising:

a frame stamping step of forming said pilot holes, said outer leads, said inner leads including said suspension leads, and said die-pad successively in order in a thin metal plate by stamping by means of punches to thereby produce a lead frame; and a step portion stamping step of forming a Z-shaped step portion having a sharp corner portion in a side portion of at least one of said inner leads by stamping by means other mismatched punches at the time of formation of said inner leads in said frame stamping step.

2. A method of producing an integrated circuit lead frame according to claim 1, wherein said Z-shaped step portion is formed in each of inner leads adjacent to suspension leads which are respectively provided outside said die-pad and located on diagonal lines so as to be opposite to each other with respect to said die-pad.

3. A method of producing an integrated circuit lead frame according to claim 1, wherein said Z-shaped step portion is provided in said at least one inner lead at its forward end portion and at its outer-lead side position far from its bonding area to be subjected to wire bonding.

4. A method of producing an integrated circuit lead frame according to claim 3, wherein said Z-shaped step portion is formed by stamping by means of a first punch which has a width matched with the distance between a suspension lead to be formed and an inner lead adjacent to said suspension lead, which is located in said distance, and which has a length at least larger than the length of from an forward end portion of said inner lead to a step portion to be formed, and a second punch which has a width larger than the width of said first punch, which has one side located in a side portion of said suspension lead and another, opposite side located in a side portion of said inner lead opposite to said side portion of said suspension lead, and which has a length equal to the length of from the step portion to be formed in said inner lead to a base end portion of said inner lead.

5. A method of producing an integrated circuit lead frame according to claim 3, wherein said Z-shaped step portion is formed by stamping by means of a first punch which has a width matched with the distance between a suspension lead to be formed and an inner lead adjacent to said suspension lead, which is located in said distance, and which has a length at least larger than the length of from an forward end portion of said inner lead to a step portion to be formed, and a second punch which has a width larger than the width of said first punch, which has only one side located in a side portion of said inner lead adjacent to said suspension lead and opposite to said suspension lead, and which has a length equal to the length of from the step portion to be formed in said inner lead to a base end portion of said inner lead.

6. A method of producing an integrated circuit lead frame according to claim 3, wherein said Z-shaped step portion is formed by stamping by means of a first punch which has a width matched with the distance between a suspension lead to be formed and an inner lead adjacent to said suspension lead, which is located in said distance, and which has a length equal to the length of from an forward end portion of said inner lead to a base end portion of said inner lead, and a second punch which is shaped like a quadrangle in section, and which has a side half located in a side portion of said inner lead adjacent to said suspension lead and opposite to said suspension lead and an opposite side half located in the distance between said suspension lead and said inner lead adjacent to said suspension lead.

7. A method of producing an integrated circuit lead frame having a plurality of pilot holes, a die-pad onto which an integrated circuit chip is to be fixed, a plurality of suspension leads for supporting said die-pad, a number of inner leads provided around said die-pad so as to be separated from said die-pad at a predetermined distance, and connected through wires to electrodes of said integrated circuit chip fixed onto said die-pad, and a number of outer leads corresponding to said number of inner leads, said method comprising:

a frame stamping step of forming said pilot holes in a thin metal plate by stamping by means of a punch and then forming said outer leads, said inner leads including said suspension leads and said die-pad in arbitrary order in said thin metal plate by stamping by means of punches to thereby produce a lead frame; and a step portion stamping step of forming a Z-shaped step portion having a sharp corner portion in a side portion of at least one of said inner leads by stamping by means of other mismatched punches at the time of formation of said inner leads in said frame stamping step.

8. A method of producing an integrated circuit lead frame according to claim 7, wherein said Z-shaped step portion is formed in each of inner leads adjacent to suspension leads which are located on diagonal lines so as to be opposite to each other with respect to said die-pad.

9. A method of producing an integrated circuit lead frame according to claim 7, wherein said Z-shaped step portion is provided in said at least one inner lead at its forward end portion and at its outer-lead side position far from its bonding area to be subjected to wire bonding.

10. A method of producing an integrated circuit lead frame having a plurality of pilot holes, a die-pad onto which an integrated circuit chip is to be fixed, a plurality of suspension leads for supporting said die-pad, a number of inner leads provided around said die-pad so as to be separated from said die-pad at a predetermined distance, and connected through wires to electrodes of said integrated circuit chip fixed onto said die-pad, and a number of outer leads corresponding to said number of inner leads, said method comprising:
a frame stamping step of forming said pilot holes in a thin metal plate by stamping by means of a punch and then forming said outer leads, said inner leads including said suspension leads and said die-pad in arbitrary order in said thin metal plate by stamping by means of punches to thereby produce a lead frame; and
a notch portion stamping step of forming a notch portion having a sharp corner portion in any of said outer leads, said inner leads, said suspension leads and said die-pad by stamping by means of other mismatched punches simultaneously with formation of said any of said outer leads, said inner leads, said suspension leads and said die-pad in said frame stamping step.

11. A method of producing an integrated circuit lead frame according to claim 10, wherein said notch portion is formed in each of inner leads adjacent to suspension leads which are located on diagonal lines so as to be opposite to each other with respect to said die-pad.

12. A method of producing an integrated circuit lead frame according to claim 10, wherein said notch portion is provided in at least one of said inner leads at its forward end portion and at its outer-lead side position far from its bonding area to be subjected to wire bonding.

13. A method of producing an integrated circuit lead frame having a plurality of pilot holes, a die-pad onto which an integrated circuit chip is to be fixed, a plurality of suspension leads for supporting said die-pad, a number of inner leads provided around said die-pad so as to be separated from said die-pad at a predetermined distance, and connected through wires to electrodes of said integrated circuit chip fixed onto said die-pad, and a number of outer leads corresponding to said number of inner leads, said method comprising:
a frame stamping step of forming said pilot holes, said outer leads, said inner leads including said suspension leads and said die-pad in arbitrary order in a thin metal plate by stamping by means of punches to thereby produce a lead frame; and
a notch portion stamping step of forming a notch portion having a sharp corner portion in any of said pilot holes, said outer leads, said inner leads, said suspension leads and said die-pad by stamping by means of other mismatched punches simultaneously with formation of said any of said pilot holes, said outer leads, said inner leads, said suspension leads and said die-pad in said frame stamping step.

14. A method of producing an integrated circuit lead frame according to claim 13, wherein said notch portion is formed in each of inner leads adjacent to suspension leads which are located on diagonal lines so as to be opposite to each other with respect to said die-pad.

15. A method of producing an integrated circuit lead frame according to claim 13, wherein said notch portion is provided in at least one of said inner leads at its forward end portion and at its outer-lead side position far from its bonding area to be subjected to wire bonding.

16. A method of producing an integrated circuit lead frame having a plurality of pilot holes, a die-pad onto which an integrated circuit chip is to be fixed, a plurality of suspension leads for supporting said die-pad, a number of inner leads provided around said die-pad so as to be separated from said die-pad at a predetermined distance, and connected through wires to electrodes of said integrated circuit chip fixed onto said die-pad, and a number of outer leads corresponding to said number of inner leads, said method comprising:
a notch portion stamping step of forming notch portions having sharp corner portions in a thin metal plate any of positions where said pilot holes, said outer leads, said inner leads containing said suspension leads and said die-pad are formed by stamping by means of mismatched punches; and
a frame stamping step of forming said pilot holes, said outer leads, said inner leads including said suspension leads and said die-pad in a thin metal plate in arbitrary order by stamping by means of punches to thereby produce a lead frame, said frame stamping step being carried out after said notch portion stamping step is carried out.

17. A method of producing an integrated circuit lead frame according to claim 16, wherein said notch port,on is formed in each of inner leads adjacent to suspension leads which are located on diagonal lines so as to be opposite to each other with respect to said die-pad.

18. A method of producing an integrated circuit lead frame according to claim 16, wherein said notch portion is provided in at least one of said inner leads at its forward end portion and at its outer-lead side position far from its bonding area to be subjected to wire bonding.

* * * * *